United States Patent
Huang et al.

(10) Patent No.: US 7,994,656 B2
(45) Date of Patent: Aug. 9, 2011

(54) POWER SUPPLY SYSTEM AND METHOD

(75) Inventors: Tsung-Sheng Huang, Taipei Hsien (TW); Chun-Jen Chen, Taipei Hsien (TW); Duen-Yi Ho, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 197 days.

(21) Appl. No.: 12/551,463

(22) Filed: Aug. 31, 2009

(65) Prior Publication Data
US 2011/0012426 A1      Jan. 20, 2011

(30) Foreign Application Priority Data
Jul. 20, 2009   (CN) .......................... 2009 1 0304544

(51) Int. Cl.
*H02J 1/00* (2006.01)
(52) U.S. Cl. ........................................................ 307/53

(58) Field of Classification Search ..................... 307/53
See application file for complete search history.

(56) References Cited

U.S. PATENT DOCUMENTS
2010/0164289 A1* 7/2010 Umminger et al. ............. 307/55
* cited by examiner

*Primary Examiner* — Robert L. Deberadinis
(74) *Attorney, Agent, or Firm* — Zhigang Ma

(57) ABSTRACT

A power supply system includes a power supply, a daughterboard, and a motherboard. Output currents of power connectors of the motherboard and impedances of copper foils between every two adjacent power connectors of the motherboard are obtained via simulation. A voltage of one power connector of the motherboard is predetermined. Therefore, desired impedances of copper foils between VRM connectors and corresponding power connectors on the daughter board are determined via calculations, to make currents passing through the power connectors of the motherboard equal to each other.

8 Claims, 3 Drawing Sheets

POWER SUPPLY SYSTEM AND METHOD

BACKGROUND

1. Technical Field

The present disclosure relates to power supply systems and methods, and particularly to a power supply system having a motherboard and a power supply method to make currents passing through power connectors of the motherboard balanced.

2. Description of Related Art

Generally, a power supply is connected to a motherboard of a computer via a daughterboard. The daughterboard functions as a conversion board to convert power and input or output signals for the motherboard. When the motherboard needs a significant amount of current, more than two power connectors are provided on the motherboard to receive the current from the power supply for loads, in order to avoid the current passing through a single power connector and possibly damaging the single power connector.

However, distances from the power connectors to the loads on the motherboard are different, and most of the current passes through a power connector closest to the loads, therefore, currents passing through the power connectors of the motherboard are imbalanced. Such imbalanced current may result damages to the power connector closest to the loads.

DETAILED DESCRIPTION

Figure 1:
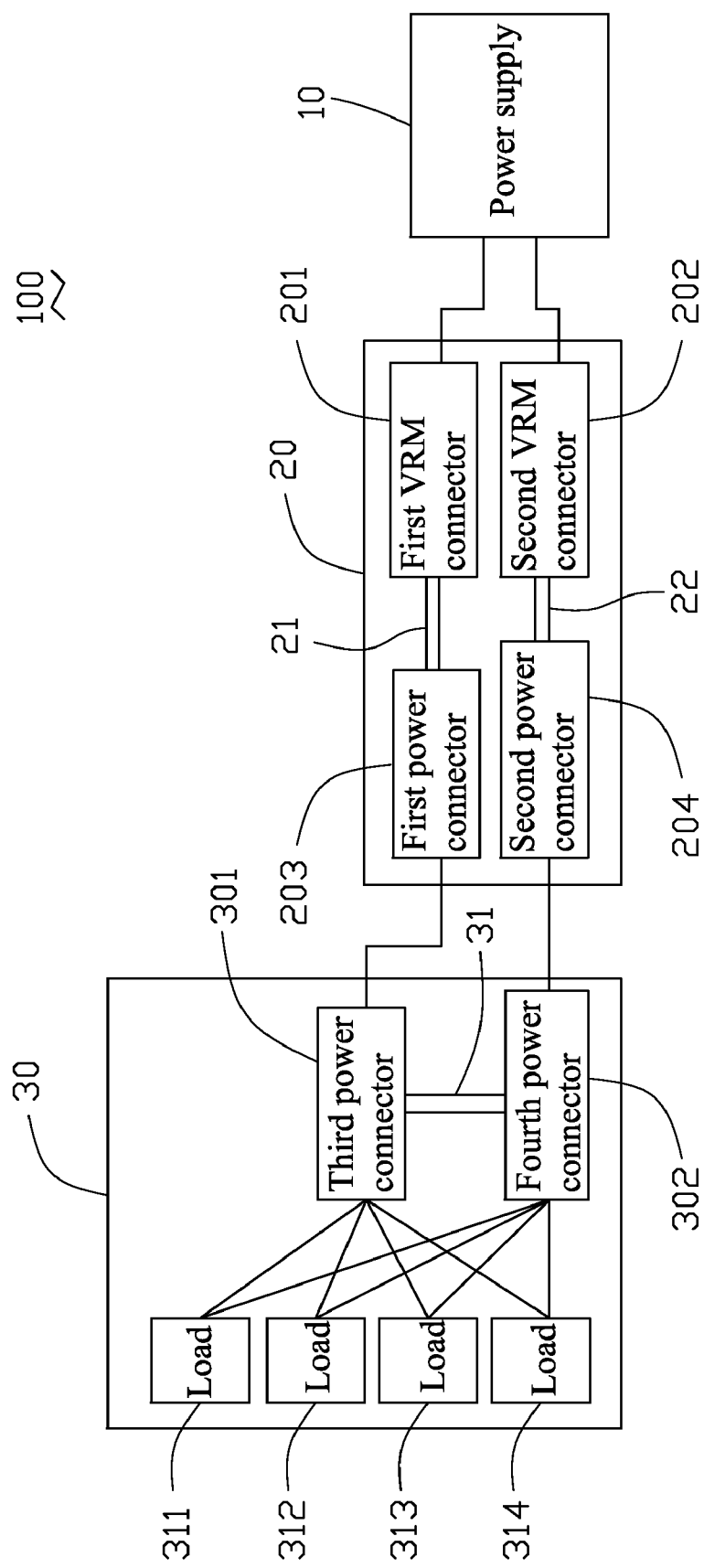
FIG. 1 is a block diagram of an exemplary embodiment of a power supply system.

Referring to FIG. 1, an exemplary embodiment of a power supply system 100 includes a power supply 10, a daughterboard 20, and a motherboard 30.

The daughterboard 20 includes a first voltage regulator module (VRM) connector 201, a second VRM connector 202, a first power connector 203, and a second power connector 204. The first VRM connector 201 and the second VRM connector 202 are connected to the power supply 10 to receive a working voltage. The first VRM connector 201 is connected to the first power connector 203 via a first copper foil 21 with a desired impedance R1. The second VRM connector 202 is connected to the second power connector 204 via a second copper foil 22 with a desired impedance R2.

The motherboard 30 includes a third power connector 301, a fourth power connector 302, and four loads 311-314. The third power connector 301 and the fourth power connector 302 are respectively connected to the first power connector 201 and the second power connector 202, to receive the working voltage from the power supply 10 for the loads 311-314. The third power connector 301 is connected to the fourth power connector 302 via a third copper foil 31 with an impedance RC.

Figure 2:
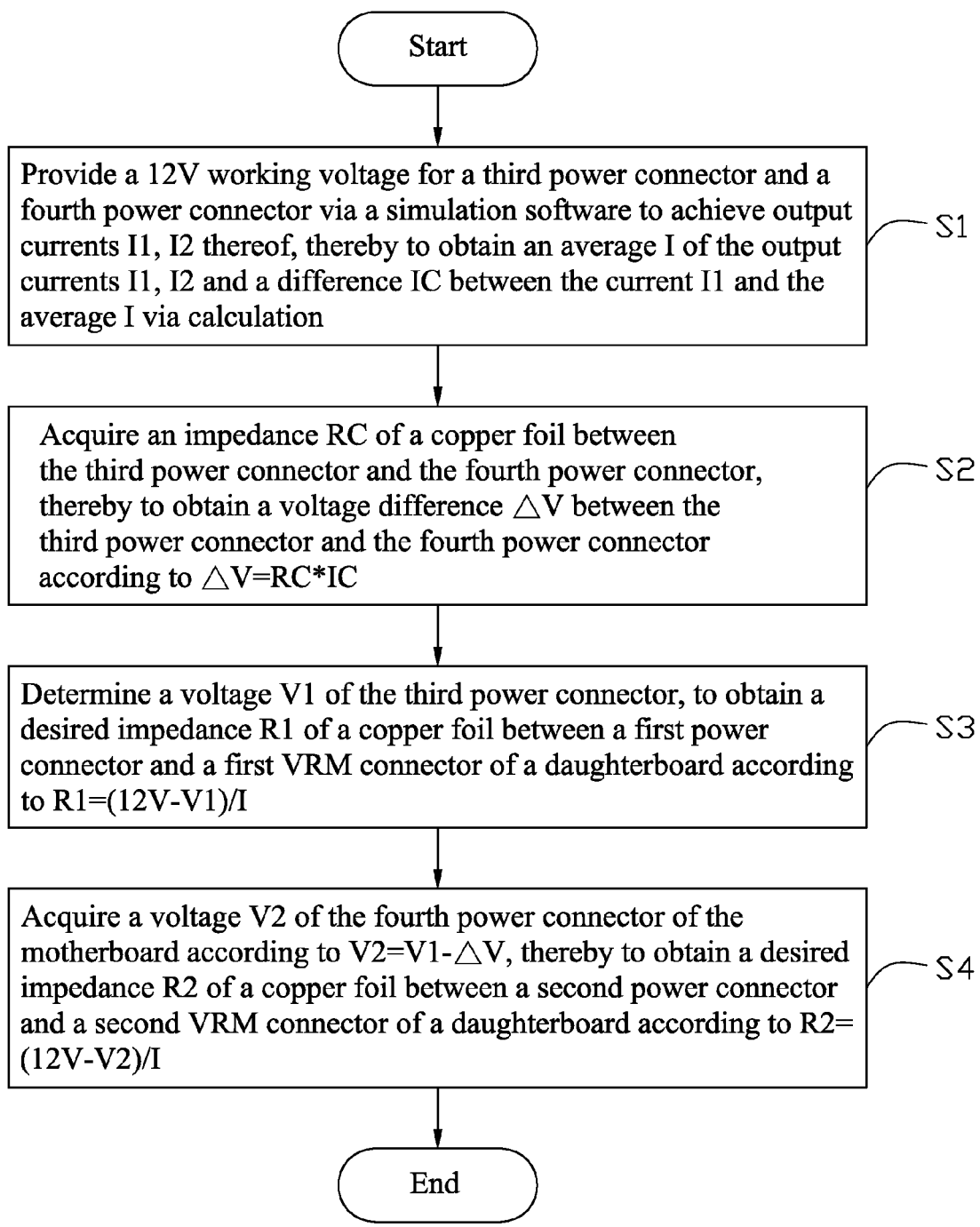
FIG. 2 is flowchart of an exemplary embodiment of a power supply method.

Referring to FIG. 2, a power supply method is provided, which inversely determines how to get the desired impedance R1 of the first copper foil 21 and the desired impedance R2 of the second copper foil 22 of the daughterboard 20 to make output currents of the first power connector 203 and the second power connector 204 equal to each other, thereby making the currents passing through the third power connector 301 and the fourth power connector 302 of the motherboard 30 equal to each other. The power supply method includes the following steps.

Figure 3:
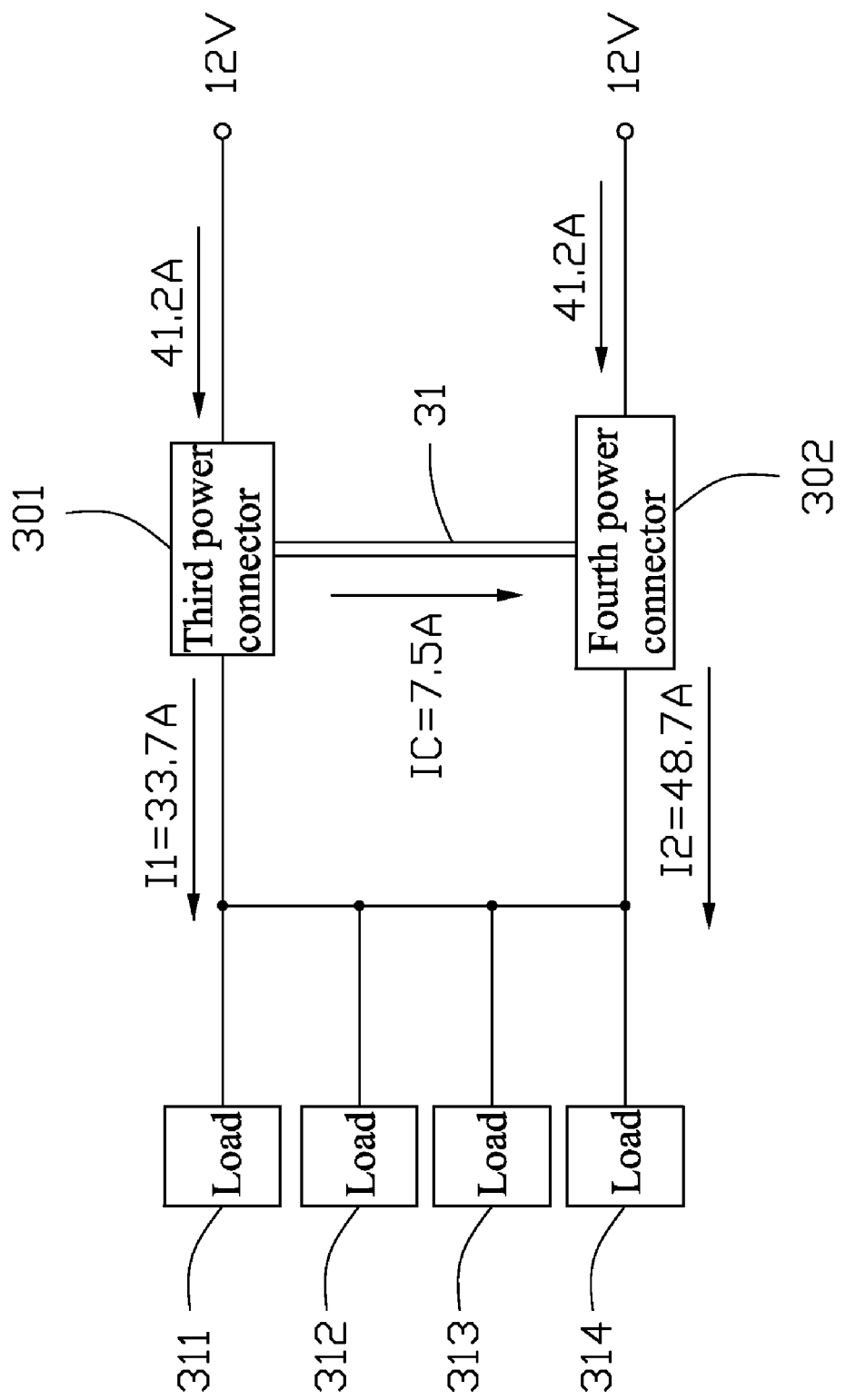
FIG. 3 is an equivalent circuit diagram of the power supply system of FIG. 1 for simulation.

In step S1, referring to FIG. 3, the third power connector 301 and the fourth power connector 302 of the motherboard 30 are simulated to be provided with a 12 volt (V) working voltage in a simulation software. In one exemplary embodiment, a rated current of each of the loads 311-314 is 20.6 amperes (A), and a rated voltage of each of the loads 311-314 is 12V. The power supply 10 is capable of providing a 12V working voltage. Therefore, an output current I1 about 33.7 A of the third power connector 301 and an output current I2 about 48.7 A of the fourth power connector 302 can be achieved via the simulation software when the third power connector 301 and the fourth power connector 302 are simulated to be provided with the 12V working voltage.

In order to make currents passing through the third power connector 301 and the fourth power connector 302 equal to each other, the currents passing through the third power connector 301 and the fourth power connector 302 both should be an average of the output currents I1 and I2, which is I=(I1+I2)/2=(33.7 A+48.7 A)/2=41.2 A. Therefore, a current IC passing through the third copper foil 31 from the third power connector 301 to the fourth power connector 302 can be obtained according to IC=I−I1=I2−I=41.2−33.7=48.7−41.2=7.5 A.

In step S2, the impedance RC of the third copper foil 31 can be achieved in the simulation software, which is about 0.634422 milliohms (m Ω). Therefore, a voltage difference ΔV between the third power connector 301 and the fourth power connector 302 can be obtained according to ΔV=RC*IC=0.634422 m Ω *7.5 A=4.758165 mV.

In step S3, a practical voltage V1 of the third power connector 301 is determined to be about 11.92V. In theory, the voltage V1 of the third power connector 301 should be equal to the 12V working voltage provided by the power supply 10. However, a part of the 12V working voltage is consumed on the daughterboard 20 when the 12V working voltage from the power supply 10 is provided to the motherboard 30 via the daughterboard 20. Therefore, in practice, the voltage V1 of the third power connector 301 is less than 12V. In another exemplary embodiment, the voltage V1 of the third power connector 301 may be other values less than the working voltage provided by the power supply 10. Therefore, the desired impedance R1 of the first copper foil 21 on the daughterboard 20 can be obtained according to R1=(12V−V1)/I=(12V−11.92)/41.2 A=1.94175 mΩ.

In step S4, a voltage V2 of the fourth power connector 302 can be obtained according to V2=V1−ΔV=11.92V−4.758165 mV=11.915242V. Therefore, the desired impedance R2 of the second copper foil 22 on the daughterboard 20 can be obtained according to R2=(12V−V2)/I=(12V−11.915242V)/41.2 A=2.057234 m Ω.

Therefore, the currents passing through the third power connector 301 and the fourth power connector 302 both can be equal to the average I about 41.2 A when the desired impedance R1 of the first copper foil 21 is determined to be 1.94175 m Ω and the desired impedance R2 of the second copper foil 21 is determined to be 2.057234 m Ω. Therefore, the currents passing through the third power connector 301 and the fourth power connector 302 are equal according to the method mentioned above.

In addition, according to formulas R1=(12V−V1)/I, R2=(12V−V2)/I and V2=V1−ΔV, a relation between the desired impedance R1 of the first copper foil 21 and the desired impedance R2 of the second copper foil 22 can be obtained, which is R2−R1=ΔV/I. That is, a difference between the desired impedance R1 of the first copper foil 21 and the desired impedance R2 of the second copper foil 22 is equal to the voltage different ΔV between the third power connector 301 and the fourth power connector 302 divided by the average I of the output currents I1 and I2.

In addition, according to R2−R1=ΔV/I=(IC*RC)/I=[I2−(I1+I2)/2]*2RC/(I1+I2), when the voltage V1 of the third power connector 301 of the motherboard 30 has been determined, and the output current I1 of the third power connector 301, the output currents I2 of the fourth power connector 302, and the impedance RC of the third copper foil 31 have been achieved via simulation, the desired impedance R1 of the first copper foil 21 and the desired impedance R2 the second foil 22 of the daughterboard 20 can be determined.

In another exemplary embodiment, the steps of the method can be altered. The motherboard 30 also can include more than two power connectors. Currents passing through the more than two power connectors can be equal to each other when the desired impedances of the copper foils between the corresponding power connectors and VRM connectors on the daughterboard 20 are determined according to the method mentioned above.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A power supply system, comprising:
a power supply to provide a working voltage;
a daughterboard comprising a first voltage regulator module (VRM) connector, a second VRM connector, a first power connector, and a second power connector; wherein the first VRM connector and the second VRM connector are connected to the power supply to receive the working voltage; wherein the first power connector is connected to the first VRM connector via a first copper foil, and the second power connector is connected to the second VRM connector via a second copper foil; and
a motherboard comprising a third power connector, a fourth power connector, and a plurality of loads; wherein the third power connector is connected to the fourth power connector via a third copper foil; wherein the third power connector and the fourth power connector are respectively connected to the first power connector and the second power connector of the daughterboard to receive the working voltage for the plurality of loads;
wherein a difference between desired impedances of the first copper foil and the second copper foil is equal to a voltage difference between the third power connector and the fourth power connector divided by an average of output currents of the third power connector and the fourth power connector.

2. The system of claim 1, wherein the voltage difference of the third power connector and the fourth power connector is equal to a difference between the output current of the third power connector and the average of the output currents of the third power connector and the fourth power connector multiplied by an impedance of the third copper foil on the motherboard.

3. The system of claim 2, wherein the output currents of the third power connector and the fourth power connector and the impedance of the third copper foil are obtained via simulation.

4. The system of claim 1, wherein the desired impedance of the first copper foil is about 1.94175 milliohms (mΩ).

5. The system of claim 4, wherein the desired impedance of the second copper foil is about 2.057234 mΩ.

6. A power supply method for providing power from a power supply to a motherboard via a daughterboard, the daughterboard comprising a first voltage regulator module (VRM) connector and a second VRM connector connected to the power supply to receive a working voltage, the daughterboard further comprising a first power connector and a second power connector respectively connected to a third power connector and a fourth power connector of the motherboard to provide the working voltage to a plurality of loads on the motherboard; wherein the first power connector is connected to the first VRM connector via a first copper foil, the second power connector is connected to the second VRM connector via a second copper foil, and the third power connector is connected to the fourth power connector via a third copper foil, the method comprising:
providing the working voltage to the third power connector and the fourth power connector via a simulation software to obtain output currents of the third and fourth power connectors;
calculating the output currents of the third power connector and the fourth power connector to obtain an average;
acquiring an impedance of the third copper foil on the motherboard via the simulation software;
multiplying the impedance of the third copper foil by the average of the output currents of the third power connector and the fourth power connector, to obtain a voltage difference between the third power connector and the fourth power connector;
dividing a voltage difference between the working voltage and a determined voltage of the third power connector by the average of the output currents of the third power connector and the fourth power connector, to obtain a desired impedance of the first copper foil;
subtracting the voltage difference between the third power connector and the fourth power connector from the determined voltage of the third power connector, to obtain a voltage of the fourth power connector; and
dividing a voltage difference between the working voltage and the voltage of the fourth power connector by the average of the output currents of third power connector and the fourth power connector, to obtain a desired impedance of the second copper foil.

7. The method of claim 6, wherein the desired impedance of the first copper foil is about 1.94175 milliohms (mΩ).

8. The method of claim 7, wherein the desired impedance of the second copper foil is about 2.057234 mΩ.

* * * * *